(12) United States Patent
Tsai

(10) Patent No.: US 8,018,357 B1
(45) Date of Patent: Sep. 13, 2011

(54) SYSTEM AND METHOD FOR GENERATING TEST PATTERNS OF BASELINE WANDER

(75) Inventor: Tien-Ju Tsai, Tainan (TW)

(73) Assignee: Himax Media Solutions, Inc., Tainan County (TW)

(*) Notice: Subject to any disclaimer, the term of this patent is extended or adjusted under 35 U.S.C. 154(b) by 34 days.

(21) Appl. No.: 12/731,430

(22) Filed: Mar. 25, 2010

(51) Int. Cl.
*H03M 5/02* (2006.01)

(52) U.S. Cl. .......................... 341/56; 370/329

(58) Field of Classification Search .............. 341/50–75; 370/329, 344, 465; 375/260, 261, 298; 380/268
See application file for complete search history.

(56) References Cited

U.S. PATENT DOCUMENTS

| 5,925,144 | A  | * | 7/1999  | Sebaa ............................ 714/733 |
| 6,792,566 | B2 | * | 9/2004  | Chen et al. .................... 714/739 |
| 7,617,064 | B2 | * | 11/2009 | Stakely et al. ................ 702/117 |
| 7,756,253 | B2 | * | 7/2010  | Breen et al. .................... 379/45 |
| 7,899,128 | B2 | * | 3/2011  | Chimitt et al. ................ 375/261 |
| 7,907,680 | B2 | * | 3/2011  | Tsai et al. ..................... 375/316 |

* cited by examiner

*Primary Examiner* — Lam T Mai

(74) *Attorney, Agent, or Firm* — Stout, Uxa, Buyan & Mullins, LLP

(57) ABSTRACT

A system and method for generating test patterns of baseline wander, such as worst-case test patterns commonly referred to as killer packets. The number of steps required to cycle an output of a multi-level encoder in order to arrive at an anticipated level is determined. A test packet generator then generates the test patterns according to the determined steps and the state of a scrambler.

22 Claims, 17 Drawing Sheets

MDI_TX_P-MDI_TX_N

MDI_RX_P-MDI_RX_N

Out=LUT_4B5B(In)

| In[3:0] | Out[4:0] |
|---------|----------|
| 0000    | 11110    |
| 0001    | 01001    |
| 0010    | 10100    |
| 0011    | 10101    |
| 0100    | 01010    |
| 0101    | 01011    |
| 0110    | 01110    |
| 0111    | 01111    |
| 1000    | 10010    |
| 1001    | 10011    |
| 1010    | 10110    |
| 1011    | 10111    |
| 1100    | 11010    |
| 1101    | 11011    |
| 1110    | 11100    |
| 1111    | 11101    |

FIG. 5A

Out=LUT_5B4B(In)

| In[4:0] | Out[4:0] | In[4:0] | Out[4:0] |
|---------|----------|---------|----------|
| 00000 | 11111 | 10000 | 11111 |
| 00001 | 11111 | 10001 | 11111 |
| 00010 | 11111 | 10010 | 01000 |
| 00011 | 11111 | 10011 | 01001 |
| 00100 | 11111 | 10100 | 00010 |
| 00101 | 11111 | 10101 | 00011 |
| 00110 | 11111 | 10110 | 01010 |
| 00111 | 11111 | 10111 | 01011 |
| 01000 | 11111 | 11000 | 11111 |
| 01001 | 00001 | 11001 | 11111 |
| 01010 | 00100 | 11010 | 01100 |
| 01011 | 00101 | 11011 | 01101 |
| 01100 | 11111 | 11100 | 01110 |
| 01101 | 11111 | 11101 | 01111 |
| 01110 | 00110 | 11110 | 00000 |
| 01111 | 00111 | 11111 | 11111 |

FIG. 5B

```
4 3 2 1 0
┌─────────┐
│0 1 1 0 1│
└─────────┘
```
TMP_Cnt=3

TMP_Dist=3

FIG. 10A

```
4 3 2 1 0
┌─────────┐
│1 0 1 0 0│
└─────────┘
```
TMP_Cnt=2

TMP_Dist=2

FIG. 10B

AC transient time T1>T2

US 8,018,357 B1

SYSTEM AND METHOD FOR GENERATING TEST PATTERNS OF BASELINE WANDER

BACKGROUND OF THE INVENTION

1. Field of the Invention

The present invention generally relates to computer networking, and more particularly to a method and system for generating worst-case test patterns of baseline wander.

2. Description of Related Art

Ethernet is a packet-based computer networking technology that is widely used in constructing local area networks. Fast Ethernet or 100BASE-TX, for example, transfers data at a nominal rate of 100 Mbits/sec. In a Fast Ethernet system, as shown in FIG. 1, data are transferred through transformer 1A, transformer 1B and unshielded twisted-pair (UTP) cables 2 between a transmitter 3 and a receiver 4. The transmitter 3, however, functions as a high-pass filter that decays or blocks DC component of the transferred signals, resulting in a baseline wander effect. FIG. 2A and FIG. 2B are exemplary signal waveforms of the transformer 1A at the transmitter side and the transformer 1B at the receiver side, respectively. It is observed that the baseline of the signal waveform at the receiver side suffers by the baseline wander effect. The baseline wander may not be effectively resolved even when a scrambler is used in the transmitter to disperse the power spectrum. Actually, with a scrambler baseline wander can occur whenever transferred packets have correlation with the output of the scrambler.

In order to objectively test the performance of a receiver (e.g., receiver 4) regarding the baseline wander effect, the standard ANSI 263-1995 Annex A.2 defines worst-case test patterns, which are commonly called killer packets. Shown in FIG. 3 is an implementation utilizing killer packets. Specifically, the standard-defined killer packets are pre-stored in a memory device such as a read-only memory (ROM) 30 with a size of at least 2047 nibbles. A killer packet generator 31 waits for the scrambler of a transmitter 32 to reach a specific state (Scram_State) 0x79D as required by the standard. Upon detecting the specific state, the killer packet generator 31 accesses the ROM 30 to obtain the standard-defined killer packets, and then transfers the packets to the transmitter 32.

According to the conventional system for transmitting killer packets as demonstrated above, a memory device such as the ROM 30 is needed for pre-storing the killer packets. This disadvantageously increases cost, power consumption and circuit area. Moreover, the killer packet generator 31 cannot transfer the killer packets until the specific scram state 0x79D has been reached, therefore resulting in excessive latency, which may last up to 82 μs.

For the reason that such a conventional system could not effectively solve the baseline wander effect, a need has arisen to propose a novel scheme for generating worst-case test patterns of baseline wander in an effective and economical manner.

SUMMARY OF THE INVENTION

In view of the foregoing, it is an object of the embodiment of the present invention to provide a system and method for generating test patterns of baseline wander on the fly without using a memory device for storing the test patterns, and without excessive (e.g., requiring waiting) latency.

According to a system for generating test patterns of baseline wander disclosed in one embodiment of the present invention, a scrambler generates scram bits, and a multi-level encoder cycles through a number of states. A test packet generator generates the test patterns according to a state of the scrambler and the state of the multi-level encoder.

According to a method for generating test patterns of baseline wander disclosed in another embodiment of the present invention, the number of steps required to cycle an output of a multi-level encoder in order to arrive at an anticipated level is determined. The test patterns are then generated according to the determined steps and a state of a scrambler.

BRIEF DESCRIPTION OF THE DRAWINGS

FIG. 5A shows an exemplary lookup table (LUT_4B5B) for a 4B/5B encoder;

FIG. 5B shows an associated inverse lookup table (LUT_5B4B) for a 4B/5B decoder;

FIG. 10A shows an exemplary 5-bit code;

FIG. 10B shows another exemplary 5-bit code; and

DETAILED DESCRIPTION OF THE INVENTION

Figure 1:
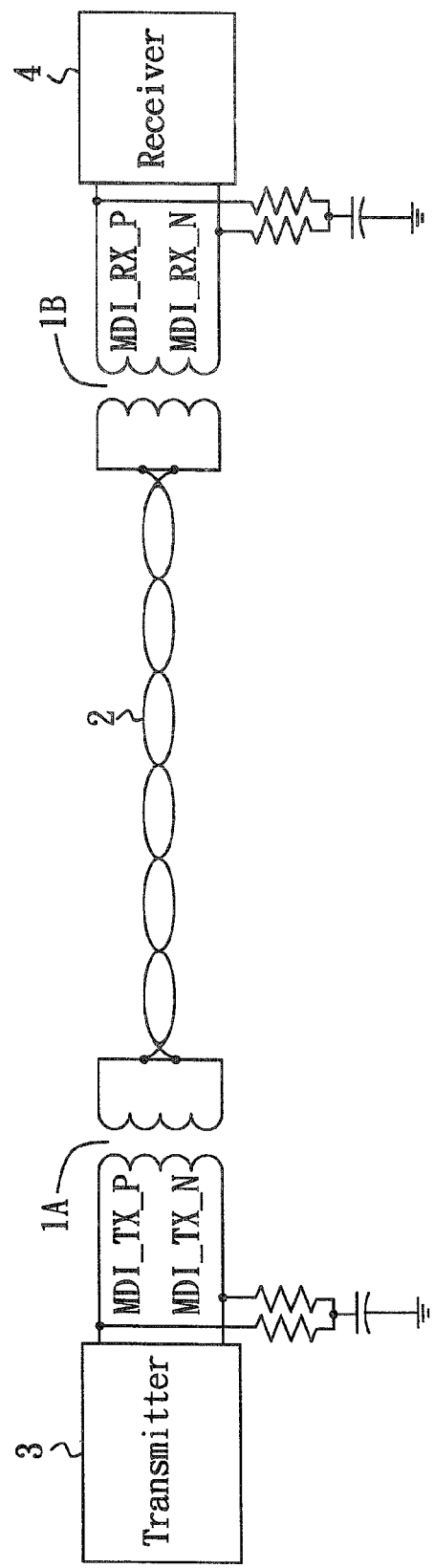
FIG. 1 shows a conventional Fast Ethernet system with transmitter and receiver sides.
Figure 2A:
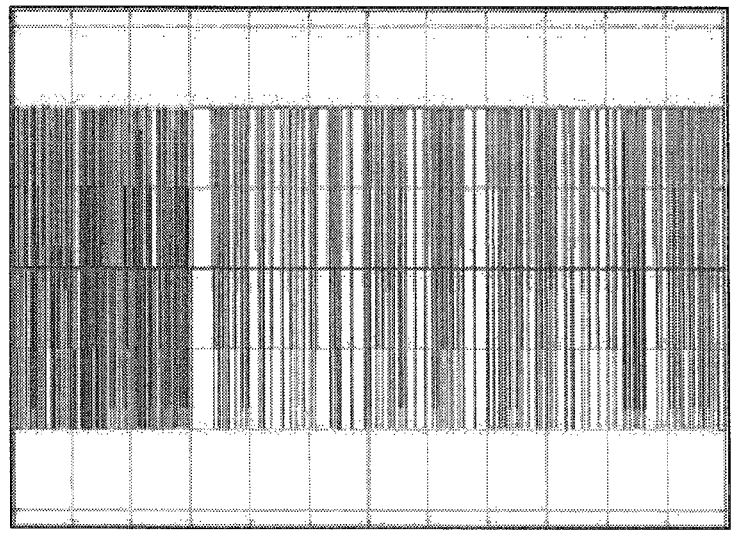
FIG. 2A and FIG. 2B show exemplary signal waveforms of a transformer at the transmitter side and a transformer at the receiver side of FIG. 1, respectively.
Figure 2B:
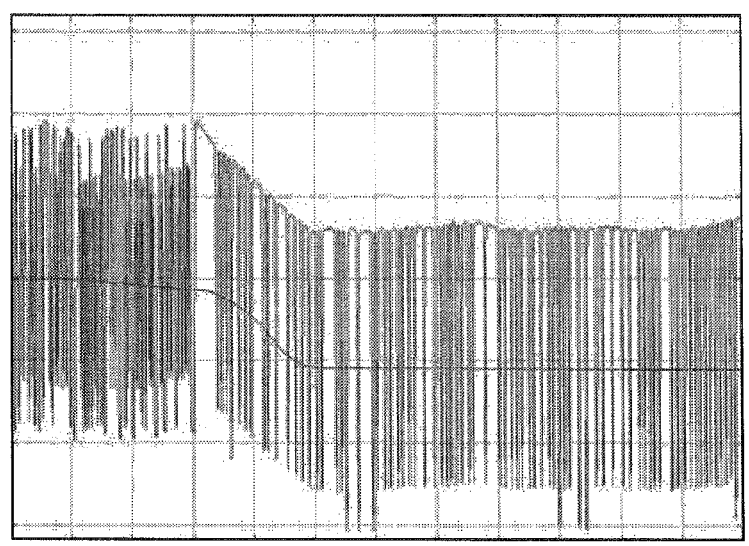
Figure 3:
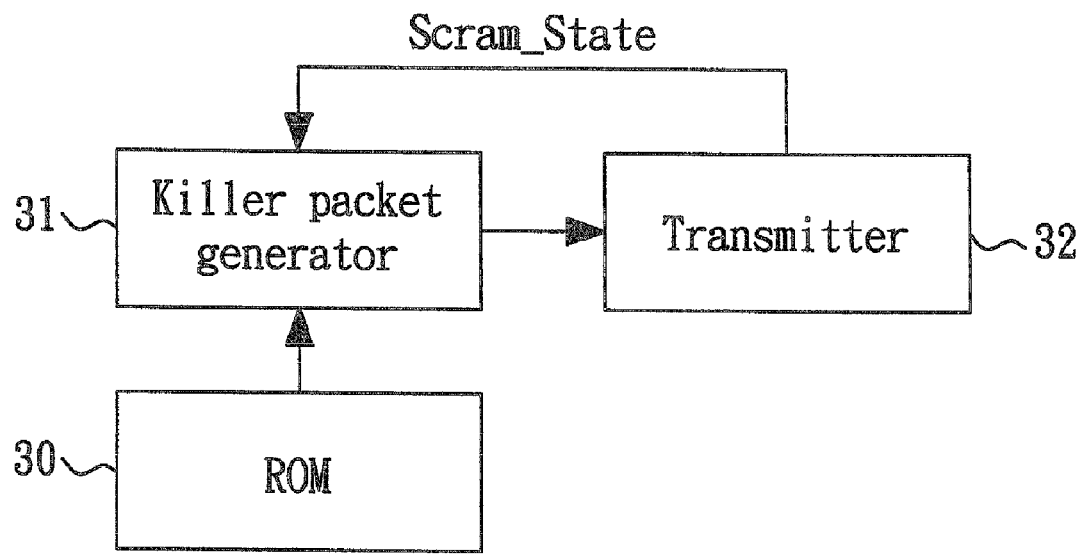
FIG. 3 shows a conventional system for transmitting killer packets.
Figure 4:
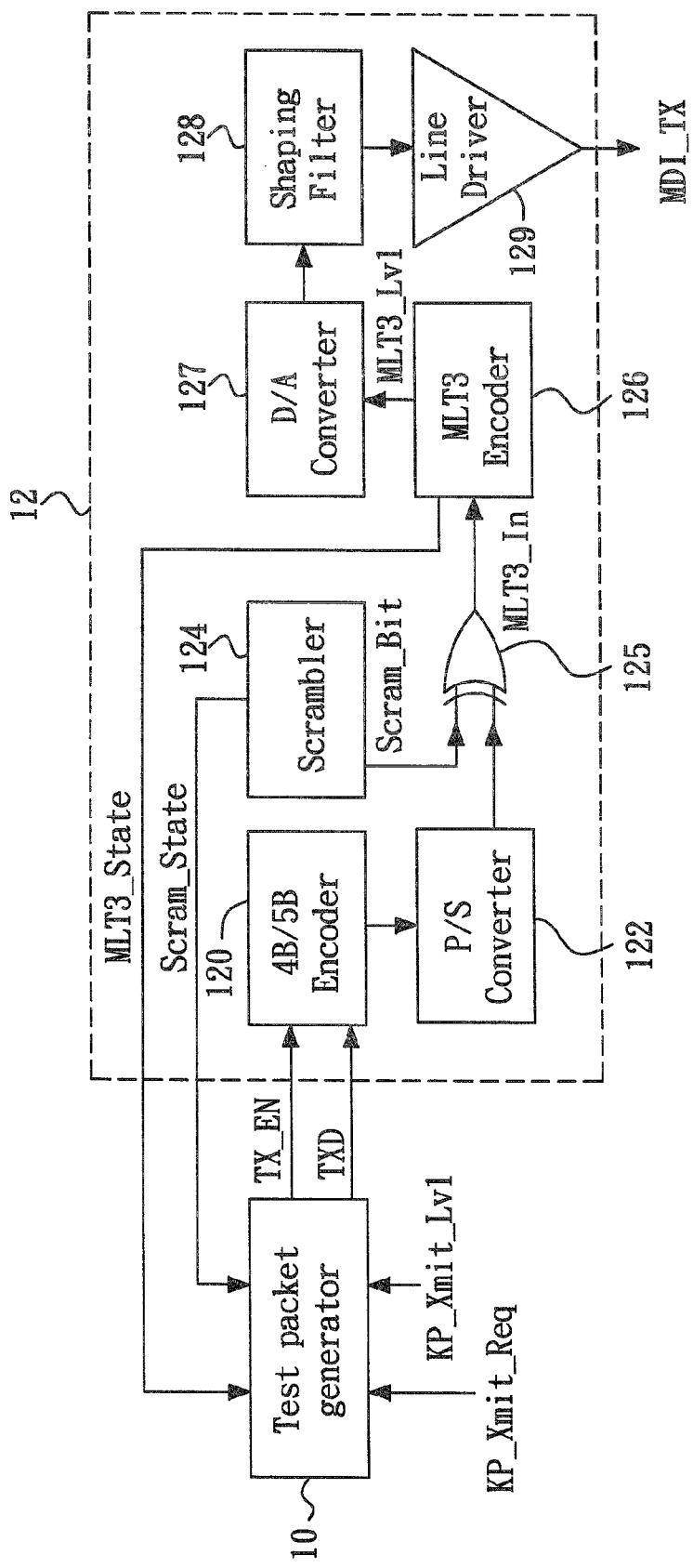
FIG. 4 is a block diagram that illustrates a system for transmitting test patterns, particularly worst-case patterns of baseline wander according to one embodiment of the present invention.

FIG. 4 is a block diagram that illustrates a system for transmitting test patterns, particularly worst-case patterns of baseline wander according to one embodiment of the present invention. Although 100BASE-TX or Fast Ethernet is illustrated in the present embodiment, other local area networks such as gigabit Ethernet or even wireless local area networks may be adopted as well.

According to one aspect of the present embodiment, a test packet generator 10 is used to generate worst-case packets, usually called killer packets, of baseline wander via data lines (TXD). In the embodiment, each packet contains a nibble or 4-bit data under control of an associated enable signal (TX_EN). The generated packets are then fed to a transmitter 12. Generally speaking, the test packet generator 10 generates the worst-case packets according to the state (Scram_State) of a scrambler 124 and the state (MLT3_State) of a multi-level transmit-3 (MLT3) encoder 126 of the transmitter 12. Further, the test packet generator 10 receives a request signal (KP_Xmit_Req) that activates the test packet generator 10, and receives an anticipation signal (KP_Xmit_Lvl) that indicates an anticipated DC term of the baseline wander. In the embodiment, the anticipation signal (KP_Xmit_Lvl) may indicate one of the following DC terms: "+1," "0" or "−1." For example, if the anticipation signal (KP_Xmit_Lvl) indicates the DC term of "+1," the output level (MLT3_Lvl) of the MLT3 encoder 126 will tend toward to the level "+1." It is noted that, in other embodiments, the anticipated DC term of the baseline wander may be predefined in the test packet generator 10, and therefore the anticipation signal (KP_Xmit_Lvl) may be omitted. Generation of the worst-case packets will be elucidated in greater detail later in the specification.

Each nibble of the generated packets is firstly line-coded, for example, by a four-bits/five-bits (4B/5B) encoder 120 that maps groups of four bits onto groups of five bits. The extra bit of each encoded group is used, for example, for providing necessary clock transitions for a receiver. The mapping of 4-bit data onto 5-bit data may be performed, for example, by a lookup table (LUT). Shown in FIG. 5A is an exemplary lookup table (LUT_4B5B) for the 4B/5B encoder 120. It is further shown in FIG. 5B an associated inverse lookup table (LUT_5B4B) for a 4B/5B decoder that inversely maps 5-bit data back to 4-bit data. It is noted that the least significant four bits of the outputs in the inverse LUT (LUT_5B4B) corresponds to the 4-bit input in the LUT (LUT_4B5B), and some outputs in the inverse LUT (LUT_5B4B) are invalid and are denoted as "11111."

Figure 6:
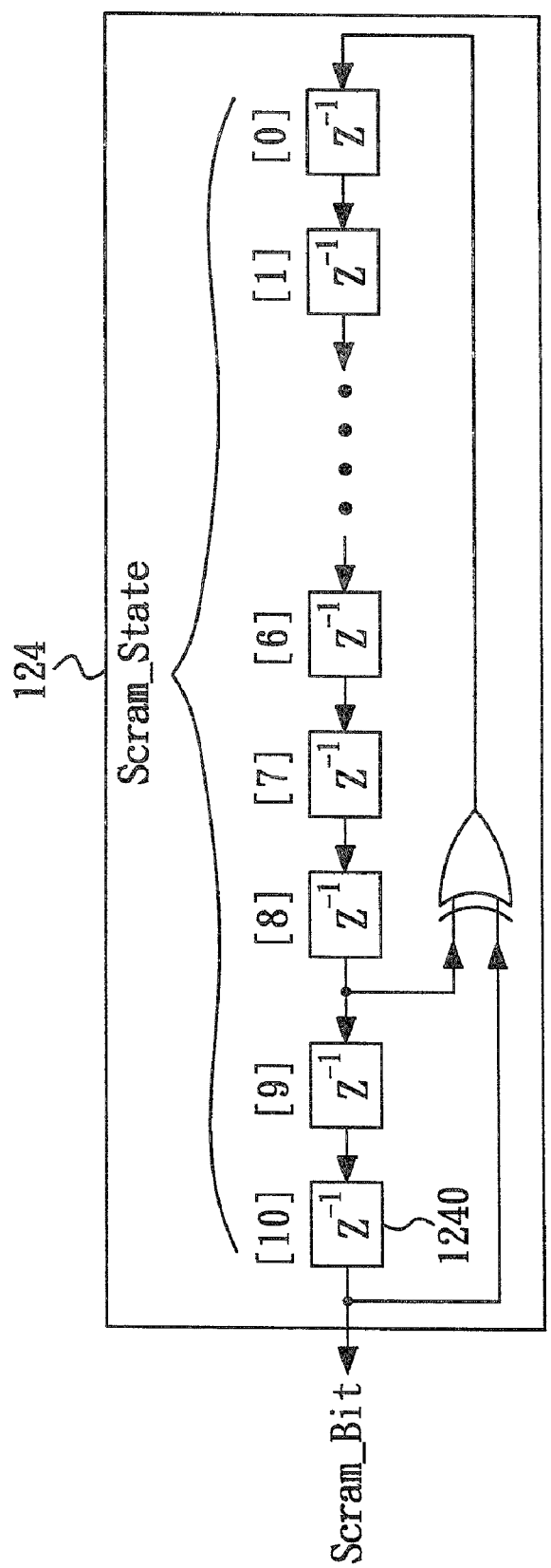
FIG. 6 shows an exemplary scrambler.

The transmitter 12 also includes a scrambler 124 or a randomizer that generates random sequences or scram bits (Scram_Bit) for the purpose of, for example, dispersing power spectrum of transmitted data. In FIG. 6 an exemplary scrambler 124 that consists of eleven delay elements 1240 can thus possess $2^{11}-1$ (=2047) scram states (Scram_State).

Figure 7:
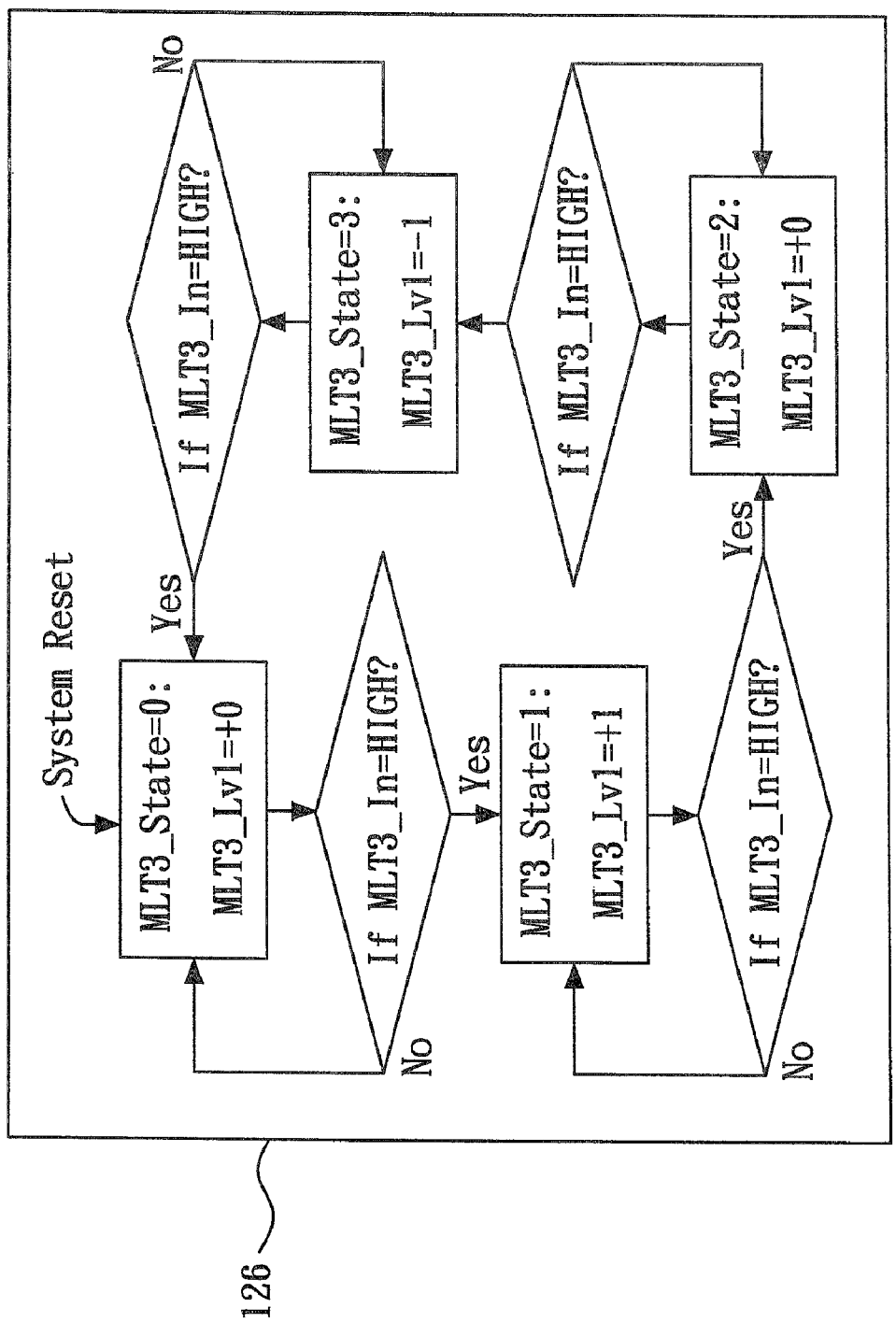
FIG. 7 shows a flow diagram of an MLT3 encoder.

Subsequently, the encoded 5B data are converted from a parallel form into a serial form, for example, by a parallel-to-serial (P/S) converter 122. The serial bit stream out of the P/S converter 122 and the scram bits (Scram_Bit) are then processed, for example, by a logic exclusive-OR (XOR) gate 125. The output of the XOR gate 125 is then forwarded as an input (MLT3_In) to the MLT3 encoder 126. As shown in the flow diagram of FIG. 7 for the MLT3 encoder of the embodiment, the output (MLT3_Lvl) of the MLT3 encoder 126 cycles through the voltage levels "+0" (state 0), "+1" (state 1), "+0" (state 2) and "−1" (state 3). The level of the output (MLT3_Lvl) moves to the next state when the input (MLT3_In) becomes high ("1"), and stays in the same state when the input (MLT3_In) is low ("0").

Afterwards, the output (MLT3_Lvl) of the MLT3 encoder 126 is converted from digital form into analog form, for example, by a digital-to-analog (D/A) converter 127. The waveform of the analog data signals out of the D/A converter 127 is then smoothed, for example, by a shaping filter 128. Finally, the data signals are driven, for example, by a line driver 129, and the driven outputs (MDI_TX) such as the worst-case packets are then transferred to a receiver, for example, via unshielded twisted-pair (UTP) cables. It is appreciated by those skilled in the pertinent art that the composing circuits of the transmitter 12 and their configuration as illustrated above may be modified, replaced or added.

Figure 8A:
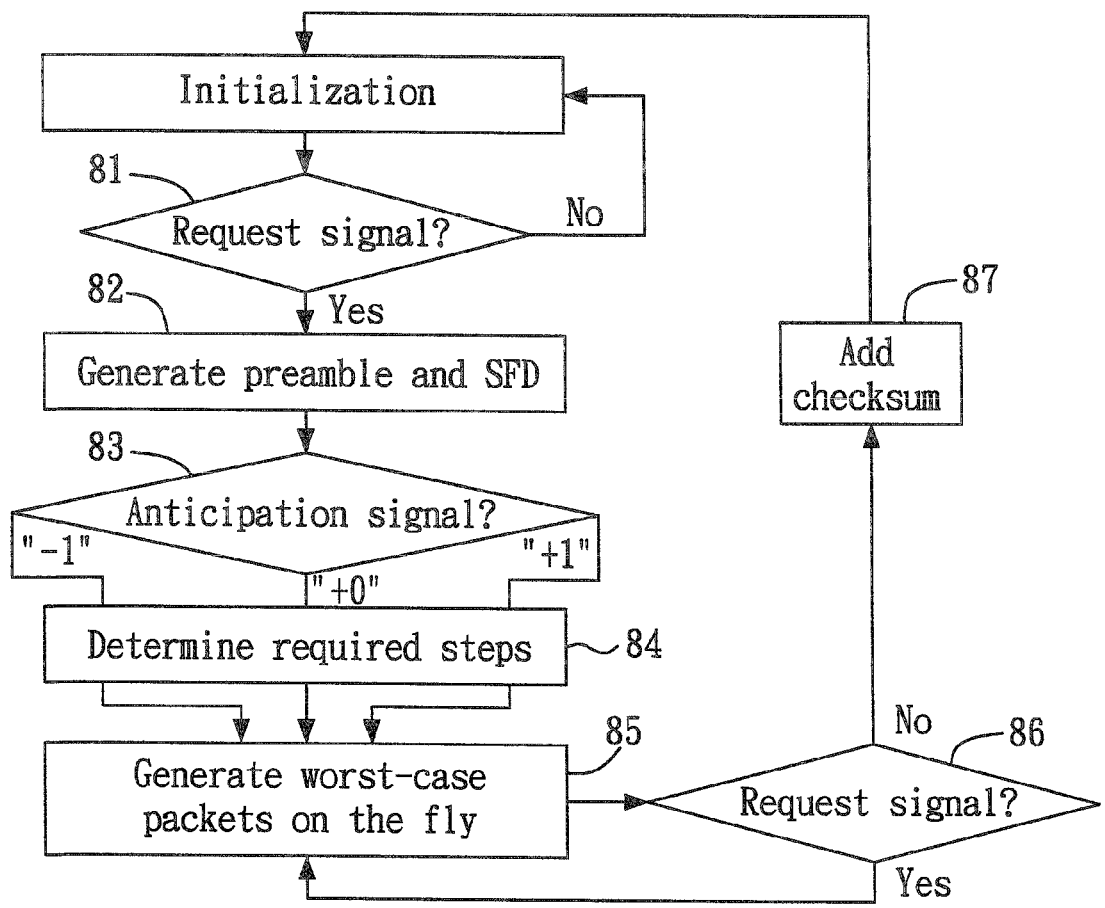
FIG. 8A is a flow diagram that illustrates a method for generating worst-case packets according to one embodiment of the present invention.
Figure 8B:
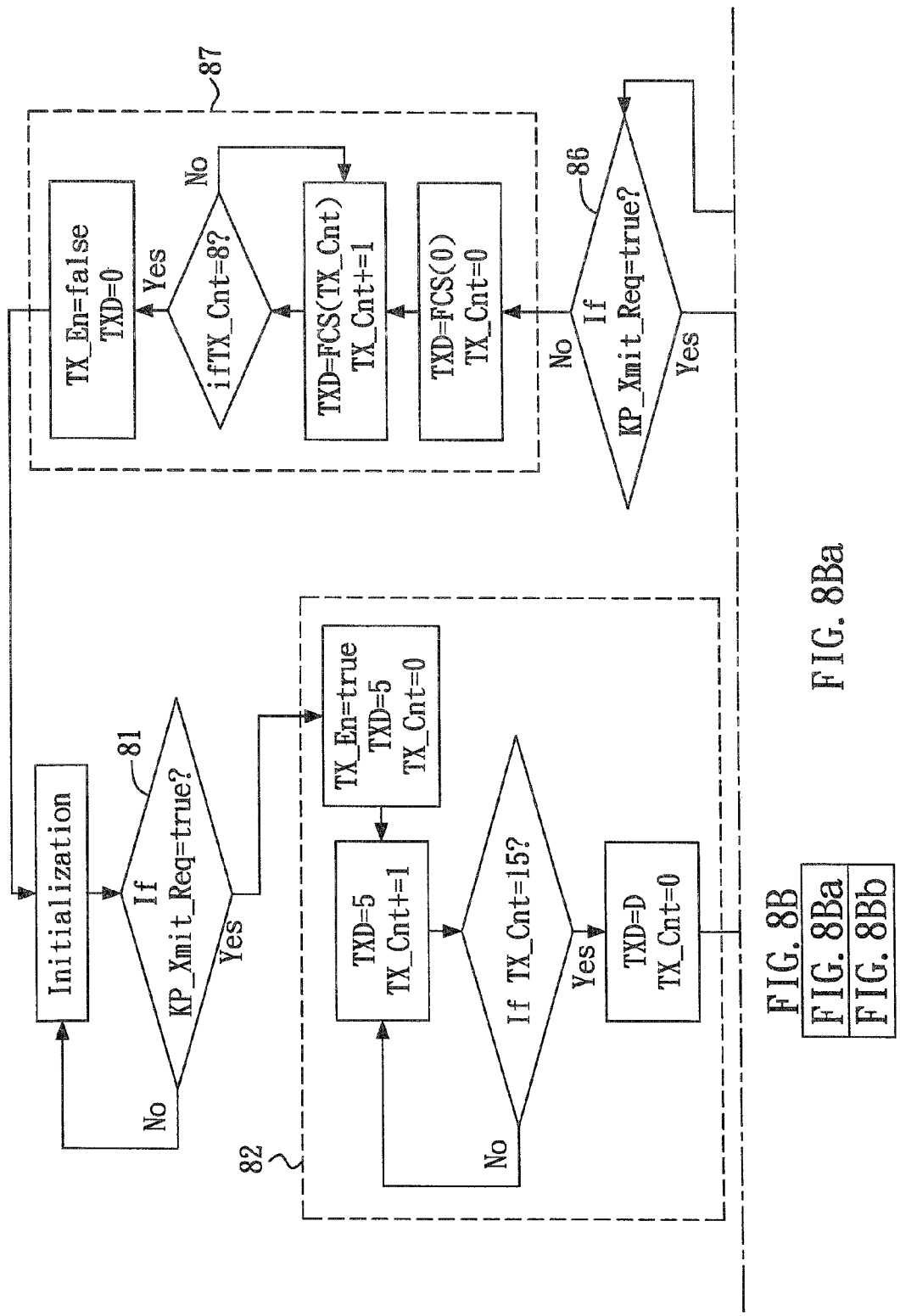
FIG. 8B shows an exemplary detailed flow diagram according to the flow diagram of FIG. 8A.

FIG. 8A is a flow diagram that illustrates a method for generating the worst-case packets or killer packets according to one embodiment of the present invention. That shown in FIG. 8B is an exemplary detailed flow diagram according to the flow diagram of FIG. 8A. The method may be implemented by hardware, software, firmware, a digital signal processor, an application-specific integrated circuit (ASIC) or their combination. Firstly, after receiving an asserted request signal (KP_Xmit_Req) in step 81, the test packet generator 10 (FIG. 4) generates a preamble and a start-of-frame delimiter (SFD) in sequence (step 82), which are then forwarded to the 4B/5B encoder 120 of the transmitter 12 via the data lines (TXD). Subsequently, in step 83, the test packet generator 10 receives an anticipation signal (KP_Xmit_Lvl) that indicates an anticipated DC term of the baseline wander. As described above, the anticipation signal (KP_Xmit_Lvl), in the embodiment, may indicate one of the following DC terms: "+1," "0" or "−1."

Afterwards, in step 84, the test packet generator 10 determines a number of steps required to cycle the output (MLT3_Lvl) of the MLT3 encoder 126 in order to arrive at the anticipated level. For example, if the anticipated level is "+1" and the current MLT3 state (MLT3_State) is "3," two steps are thus required to cycle the output (MLT3_Lvl) of the MLT3 encoder 126 in order to arrive at the anticipated level "+1." As shown in step 84 of the exemplary flow diagram, a variable (One_Val) is used to record the required steps.

Subsequently, in step 85, the test packet generator 10 generates worst-case packets on the fly. The generation of the worst-case packets will be detailed later in the accompaniment of FIG. 9A or 9B. The worst-case packets are continuously generated until the request signal (KP_Xmit_Req) is no longer asserted (step 86). After finishing the worst-case packets generation, a checksum such as frame check sequence (FCS) is added in step 87.

Figure 9A:
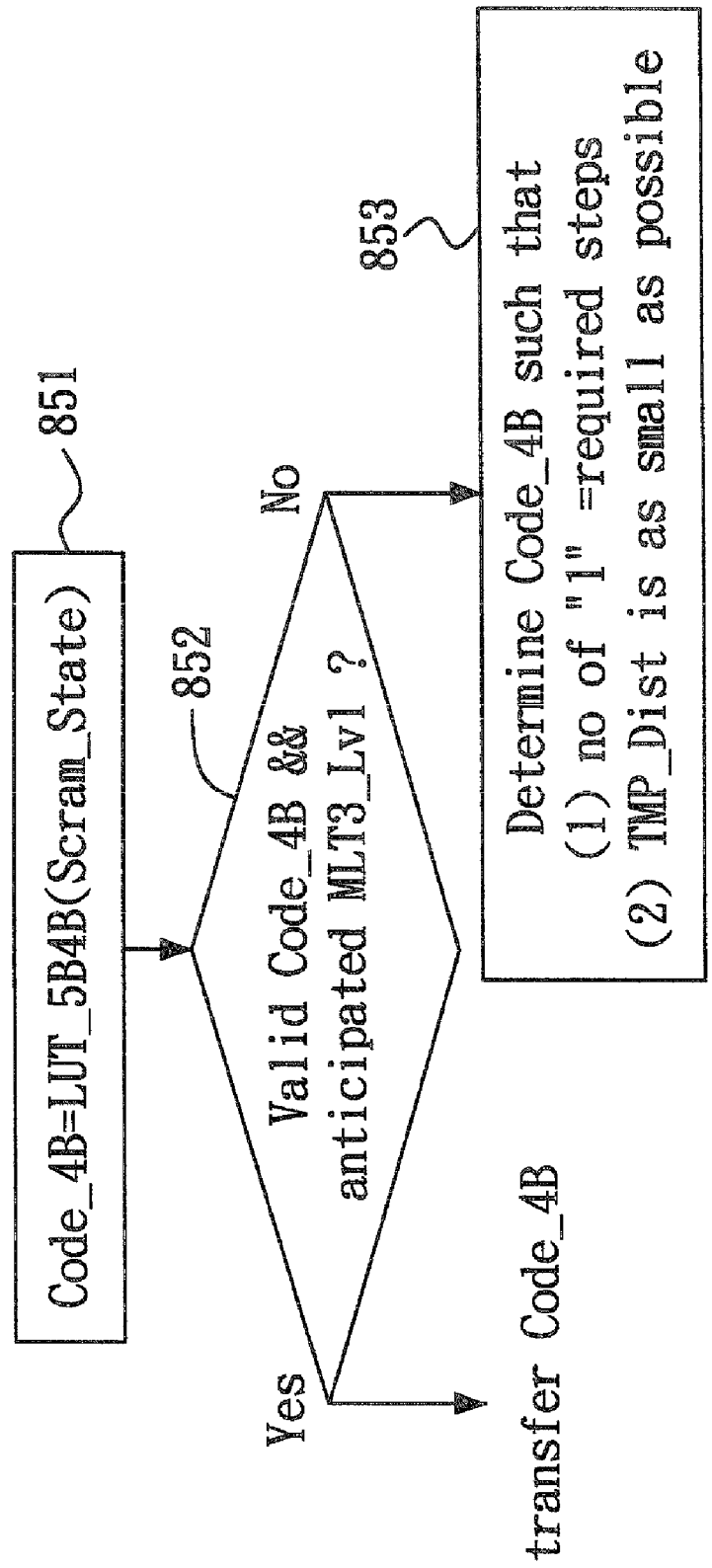
FIG. 9A is a flow diagram that illustrates the generation of worst-case packets according to one embodiment of the present invention.
Figure 9B:
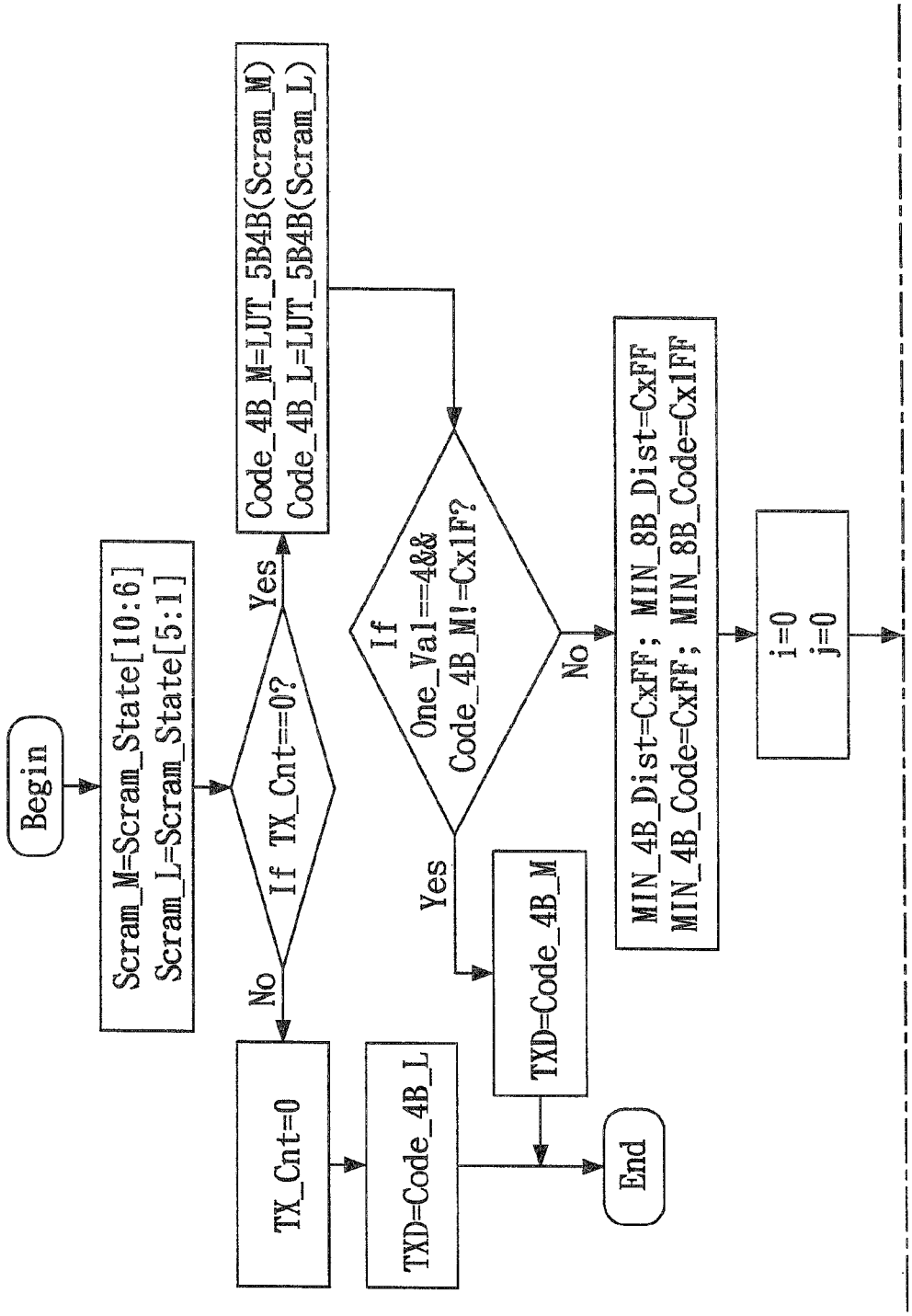
FIG. 9B shows an exemplary detailed flow diagram according to the flow diagram of FIG. 9A.
Figure 9B:
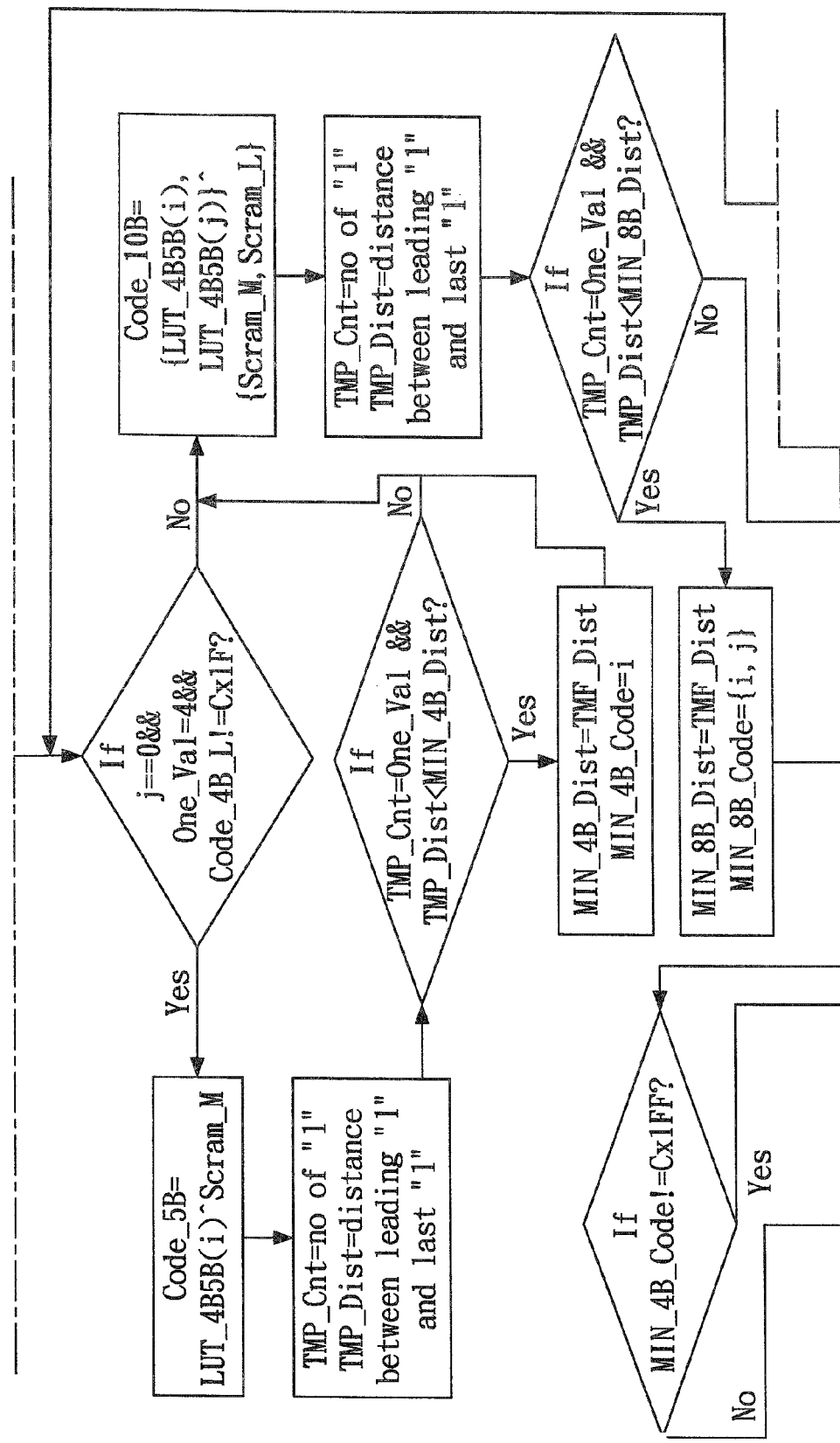
Figure 9B:
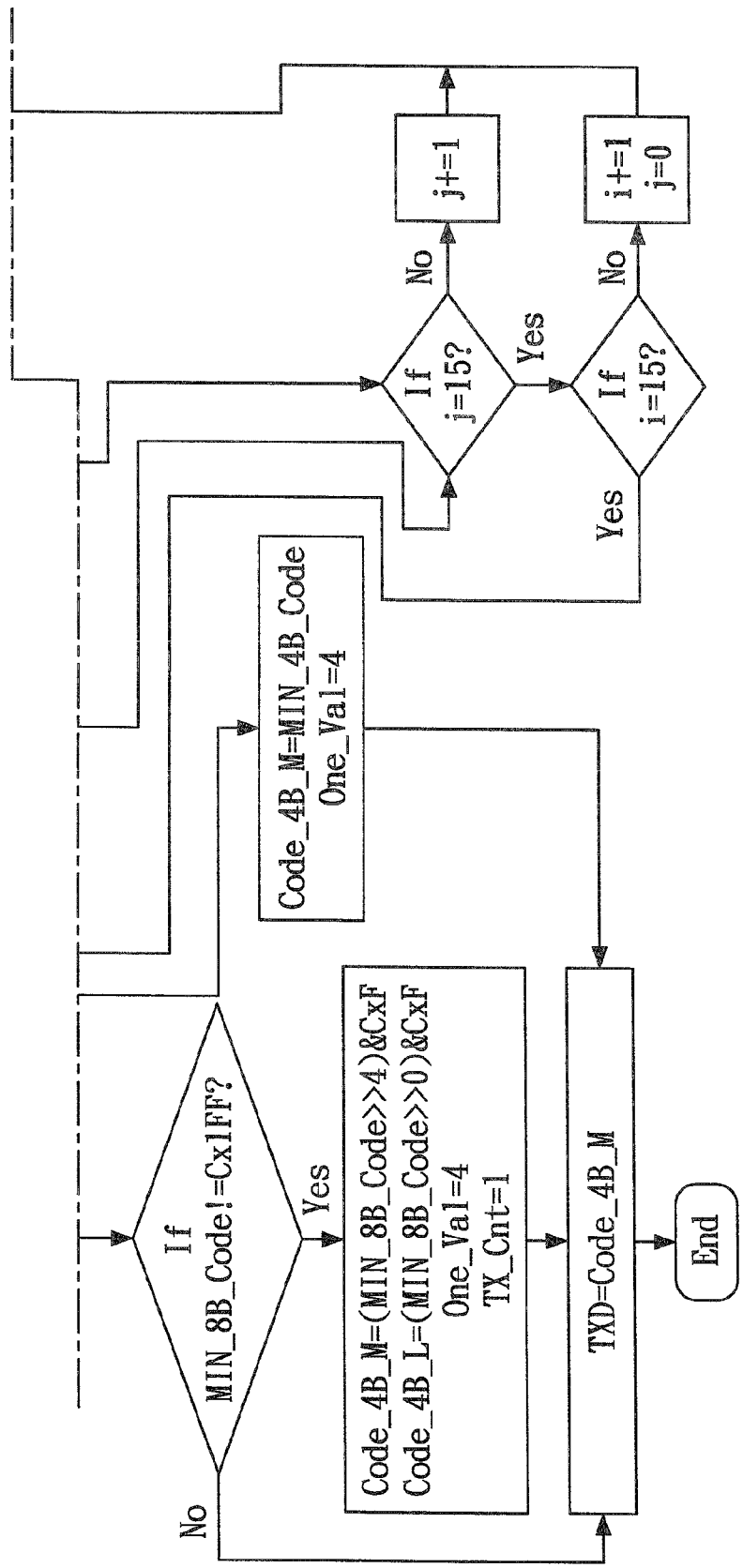

FIG. 9A is a flow diagram that illustrates the generation of the worst-case packets (i.e., step 85 in FIG. 8A or 8B) according to one embodiment of the present invention, and FIG. 9B is an exemplary detailed flow diagram according to the flow diagram of FIG. 9A. Firstly, in step 851, the scram state (Scram_State) is inversely mapped by the inverse LUT (LUT_5B4B) to obtain a 4-bit code (Code_4B). Specifically, in the embodiment, ten bits out of the scram state (Scram_State) are divided into two 5-bit scram states, that is, a high scram state (Scram_M) and a low scram state (Scram_L), which are inversely mapped to obtain two 4-bit codes. The two 4-bit codes are then processed according to the following steps. It is noted that, rather than processing two 4-bit codes at a time, in another embodiment, one or more than two 4-bit codes may be processed at a time.

Figure 8B:
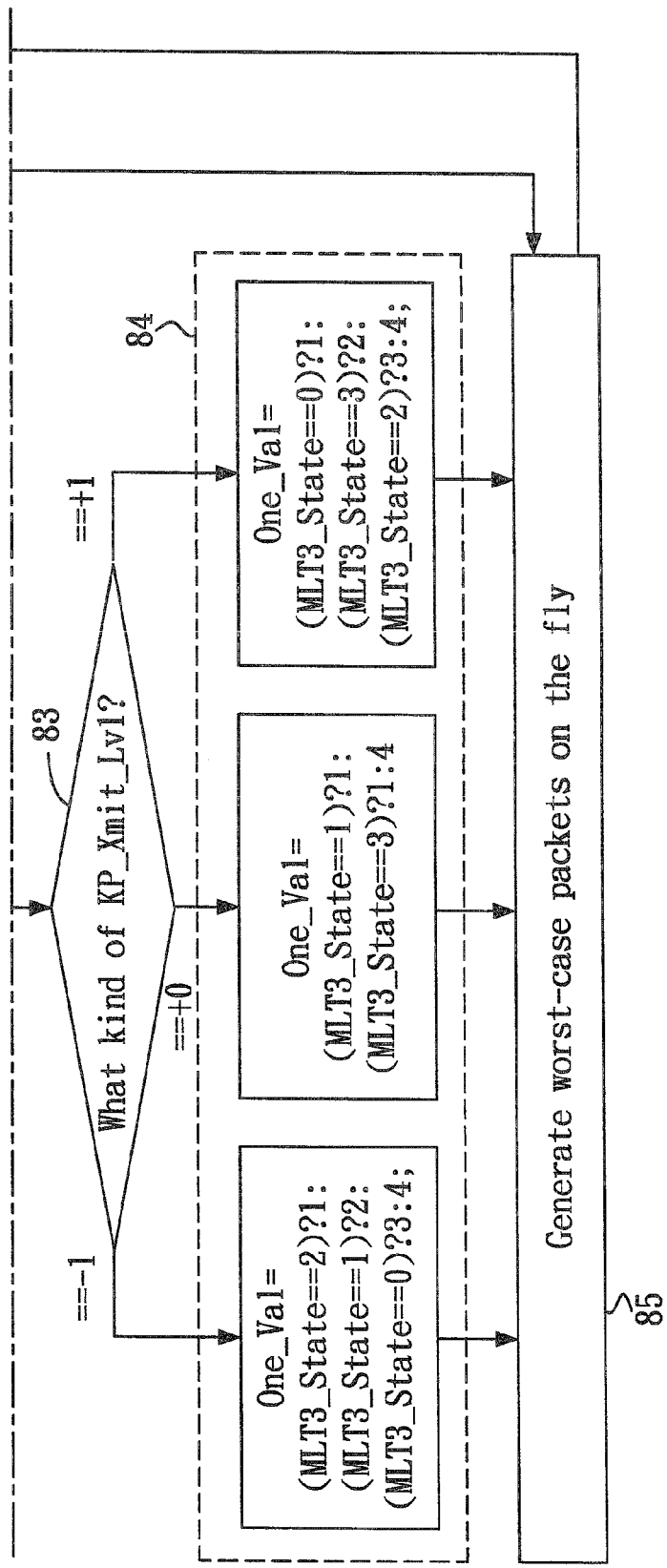

Subsequently, in step 852, if the mapped 4-bit code (Code_4B) is valid and the current output level (MLT3_Lvl) is the anticipated level of the baseline wander, the 4-bit code (Code_4B) is then transferred to the transmitter 12. Otherwise, in step 853, the test packet generator 10 determines a 4-bit code with an associated mapped 5-bit code (Code_5B) conforming to the following requirements: (1) number (TMP_Cnt) of bit "1" is equal to the required steps determined in step 84 (FIG. 8); and (2) distance (TMP_Dist) between the leading "1" and the last "1" is as small as possible. In other words, the 5-bit code (Code_5B) with least distance (TMP_Dist) among multiple candidates is determined. The content of FIG. 10A represents an exemplary 5-bit code (Code_5B) which has "1" at bit 0, bit 2 and bit 3, that is, TMP_Cnt=3. Further, the distance (TMP_Dist) between the leading "1" and the last "1" is 3, that is, TMP_Dist=3 that shown in FIG. 10B is another exemplary 5-bit code (Code_5B) which has "1" at bit 2 and bit 4, that is, TMP_Cnt=2. Further, the distance (TMP_Dist) between the leading "1" and the last "1" is 2, that is, TMP_Dist=2. According to the determination in step 853, the output (MLT3_Lvl) of the MLT3 encoder 126 may cycle to arrive at the anticipated level of baseline wander in a duration as small as possible.

Table 1 is an exemplary worst-case sequence generated according to the programming flow of FIG. 9B, and Table 2 is the test pattern defined in the standard ANSI 263-1995 Annex A.2. The generated sequence according to the present embodiment is similar to the sequence defined in the standard with similarity of 88.52%, with different data being enclosed. The generated sequence according to the present embodiment has 68.65% of the anticipated level of baseline wander, while the sequence defined in the standard has a lower 66.68% of the anticipated level.

TABLE 1

069C61DB4312B178134 1F 2F81F624 51 5
4C 92 1EB13F036B4E6B15AB0F83E4A17 6
1 D5569BA2A6BCFE5A773 91 A56F519FA4
................................................................
................................................................
711 E7 03A1C9A711D E8 41E825805957F1
BC3EAB4F02A94B5361BB43 72 7E3BE5A0

TABLE 2

069C61DB4312B178134 71 2F81F624 13 5
4C BE 1EB13F036B4E6B15AB0F83E4A17 1
3 D5569BA2A6BCFE5A773 B3 A56F519FA4
................................................................
................................................................
711 29 03A1C9A711D 2C 41E825805957F1
BC3EAB4F02A94B5361BB43 5E 7E3BE5A0

Figure 11:
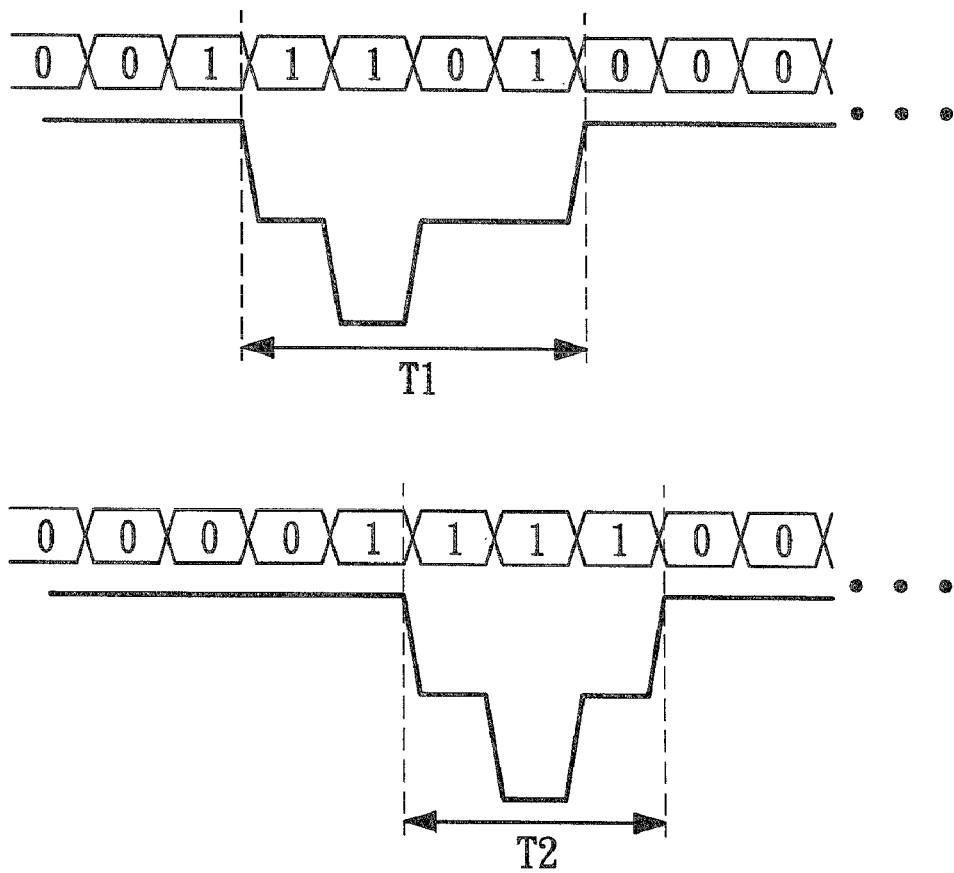
FIG. 11 shows a comparison between a standard-defined code word and a generated code word according to the embodiment.

The profoundness of the generated sequence according to the present embodiment over the sequence defined in the standard may be appreciated by comparing the standard-defined code word 0x71 and the generated code word 0x1F according to the embodiment as shown in FIG. 11. Specifically, the standard-defined code word 0x71 is XOR-ed with the scram state (Scram_State) to generate "00111_01000" as an MLT3 input (MLT3_In), and the generated code word 0x1F is XOR-ed with the scram state to generate "00001_11100" as an MLT3 input. It is observed that four cycles, that is T1, are required to arrive at the anticipated level "+1" according to the standard-defined code word, while only three cycles, that is T2, are required to arrive at the anticipated level "+1" according to the embodiment.

According to the embodiment described above, the embodiment of the present invention no longer needs a memory device such as a read-only memory (ROM) for storing the standard-defined test patterns. Instead, the test patterns are generated on the fly in the present embodiment. Moreover, the present embodiment need not wait for the scrambler to reach a specific state. Further, the test patterns according to the present embodiment have better performance compared with that defined in the standard ANSI 263-1995 Annex A.2.

Although specific embodiments have been illustrated and described, it will be appreciated by those skilled in the art that various modifications may be made without departing from the scope of the present invention, which is intended to be limited solely by the appended claims.

What is claimed is:

1. A system for generating test patterns of baseline wander, comprising:
a scrambler configured to generate scrambled bits;
a multi-level encoder configured to cycle through a plurality of states; and
a test packet generator configured to generate the test patterns according to a state of the scrambler and the state of the multi-level encoder.

2. The system of claim 1, wherein the test packet generator is configured to receive a request signal that activates the test packet generator.

3. The system of claim 1, wherein the test packet generator is configured to receive an anticipation signal that indicates an anticipated direct-current (DC) term of the baseline wander, such that an output level of the multi-level encoder tends toward the anticipated DC term.

4. The system of claim 1, further comprising a four-bits/five-bits (4B/5B) encoder configured to receive the test patterns and map groups of four bits onto groups of five bits, thereby generating encoded 5-bit data.

5. The system of claim 4, wherein the 4B/5B encoder comprises a lookup table for mapping the groups of four bits onto the groups of five bits.

6. The system of claim 4, further comprising a parallel-to-serial (P/S) converter configured to convert the encoded 5-bit data from a parallel form into a serial form, thereby generating a serial bit stream.

7. The system of claim 6, further comprising a logic gate configured to perform logical operation on the serial bit stream and the scrambled bits, thereby generating an output to the multi-level encoder in order to cycle the state of the multi-level encoder.

8. The system of claim 7, wherein the logic gate comprises an exclusive-OR (XOR) gate.

9. The system of claim 7, further comprising a digital-to-analog (D/A) converter configured to convert the output of the multi-level encoder from a digital form into an analog form, thereby generating an analog data signal.

10. The system of claim 9, further comprising:
a shaping filter configured to smooth the analog data signal; and
a line driver configured to drive the smoothed analog data signal.

11. A method for generating test patterns of baseline wander, comprising:
determining a number of steps required to cycle an output of a multi-level encoder in order to arrive at an anticipated level; and
generating the test patterns according to the determined steps and a state of a scrambler.

12. The method of claim 11, before generating the test patterns, further comprising a step of receiving a request signal that activates the test patterns generation.

13. The method of claim 12, before generating the test patterns, further comprising a step of generating a preamble and a start-of-frame delimiter.

14. The method of claim 13, further comprising a step of receiving an anticipation signal that indicates the anticipated level.

15. The method of claim 14, after generating the test patterns, further comprising a step of adding a checksum.

16. The method of claim 11, further comprising a step of receiving the test patterns and mapping groups of four bits onto groups of five bits, thereby generating encoded 5-bit data.

17. The method of claim 16, wherein the step of generating the test patterns comprises the following steps:
- inversely mapping the state of the scrambler from the 5-bit data to a 4-bit code;
- if the 4-bit code is valid and the output of the multi-level encoder is the anticipated level, transferring the 4-bit code as the test pattern;
- if the 4-bit code is not valid or the output of the multi-level encoder is not the anticipated level, determining another 4-bit code as the test pattern with an associated mapped 5-bit code conforming to the following requirements: (1) number of bit "1" is equal to the required steps, and (2) a distance between a leading "1" and a last "1" is as small as possible.

18. The method of claim 16, further comprising a step of converting the encoded 5-bit data from a parallel form into a serial form, thereby generating a serial bit stream.

19. The method of claim 18, further comprising a step of performing logical operation on the serial bit stream and scrambled bits of the scrambler, thereby generating an output to the multi-level encoder in order to cycle the state of the multi-level encoder.

20. The method of claim 19, wherein the serial bit stream and the scrambled bits undergo an exclusive-OR (XOR) operation.

21. The method of claim 19, further comprising a step of converting the output of the multi-level encoder from a digital form into an analog form, thereby generating an analog data signal.

22. The method of claim 21, further comprising the steps of:
- smoothing the analog data signal; and
- driving the smoothed analog data signal.

* * * * *